United States Patent [19]

Schmale

[11] Patent Number: 4,477,749
[45] Date of Patent: Oct. 16, 1984

[54] CIRCUIT FOR GENERATING A SAWTOOTH CURRENT IN A COIL

[75] Inventor: Peter C. Schmale, Breda, Netherlands

[73] Assignee: U.S. Philips Corporation, New York, N.Y.

[21] Appl. No.: 468,231

[22] Filed: Feb. 22, 1983

[30] Foreign Application Priority Data

Mar. 25, 1982 [NL] Netherlands ............... 8201237

[51] Int. Cl.³ .................. H01J 29/70; H01J 29/76
[52] U.S. Cl. .................... 315/397; 315/388; 315/389
[58] Field of Search ............ 315/408, 387, 388, 396, 315/397

[56] References Cited

U.S. PATENT DOCUMENTS 3,426,245  2/1969  Yurasek et al. ............. 315/397
4,054,816 10/1977  Keidl ......................... 315/387

Primary Examiner—Theodore M. Blum
Attorney, Agent, or Firm—Thomas A. Briody; William J. Streeter

[57] ABSTRACT

A circuit for generating a sawtooth current (I) in a coil (25), the coil (25) being driven during the trace periods of the sawtooth from an amplifier circuit (4, 6, 7, 9, 15) by a current, and during the shortest possible retrace periods, the amplifier circuit being blocked, the coil (25) being included in a resonant circuit (25, 20, 21, 18, 7) which further comprises a capacitor (20), a first (21) and a second diode (18) and a transistor (7). In order to prevent disturbing ringing phenomena from occurring when a retrace period of the shortest possible duration is required, the junction of the capacitor (20), the first (21) and the second diode (18) and the transistor (7) is fed-back via a resistor (23) to a signal input of an amplifier (4) comprised in the amplifier circuit (4, 6, 7, 9, 15), this signal input further being coupled to a terminal (1) for the supply of a sawtooth voltage.

2 Claims, 2 Drawing Figures

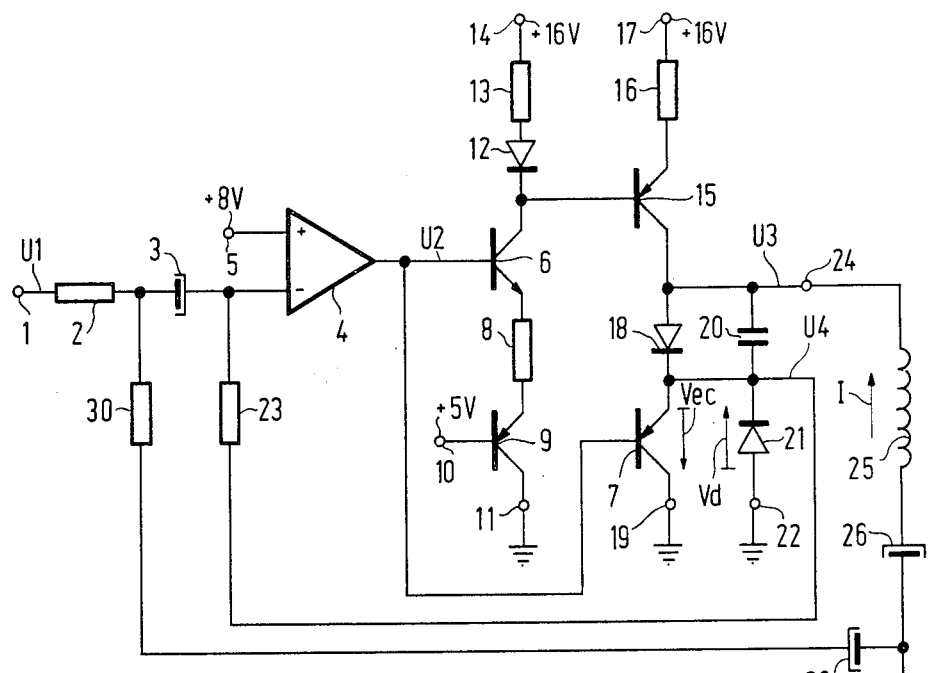
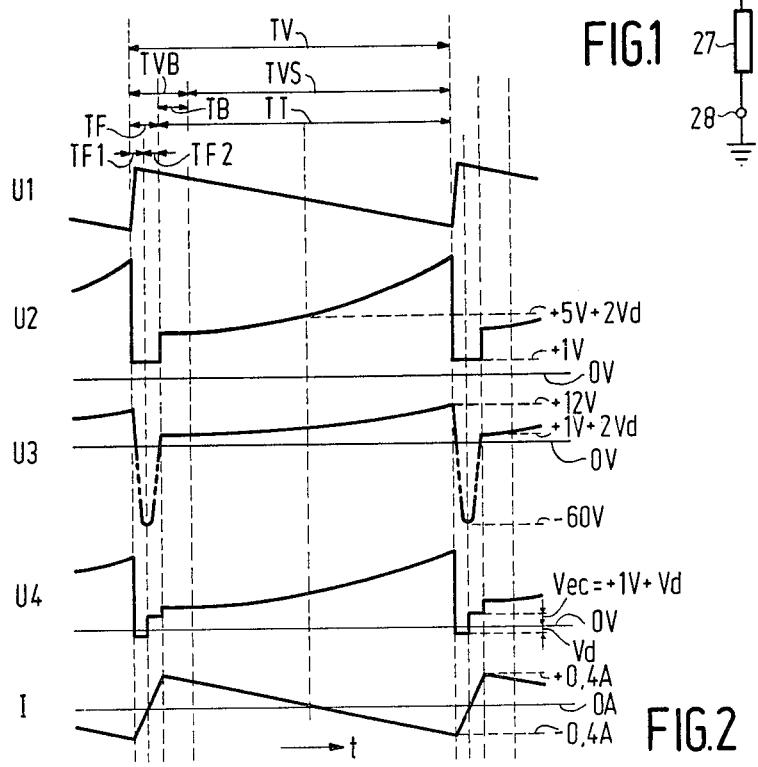
FIG.1
FIG.2

CIRCUIT FOR GENERATING A SAWTOOTH CURRENT IN A COIL

The invention relates to a circuit for generating a sawtooth current in a coil, the circuit having a first terminal for receiving a sawtooth voltage and a second terminal coupled to the coil for supplying the sawtooth current, an amplifier circuit comprising an amplifier being provided between these terminals for converting during trace periods of the sawtooth current the applied voltage into the current to be supplied, the amplifier circuit comprising during retrace periods of the sawtooth current a resonant circuit coupled to the second terminal and including at least the coil, a capacitor, first and second diodes and a transistor, the said second terminal being connected via a parallel arrangement of the capacitor and the second diode to an electrode of the first diode and of the transistor, respectively, a further electrode of which is connected to a supply voltage terminal, the junction of the capacitor, the first and second diodes which are arranged so as to have the same forward directions, and the transistor which is arranged so that it has the opposite forward direction being connected to the supply voltage terminal via the transistor which is biased during the retrace periods of the sawtooth current.

Such a circuit is disclosed in U.S. Pat. No. 4,297,621. The circuit provides the vertical electron beam deflection in a television arrangement. The coil which operates as a deflection coil for an electron beam is driven from the amplifier circuit by a current during the trace periods, the amplifier circuit being switched off during the retrace periods of the sawtooth current in order to achieve that the resonant circuit which includes the coil, the capacitor, the two diodes and the transistor becomes operative. When the amplifier circuit is switched off all the energy present in the coil is transferred via the first diode to the capacitor in the first half of a semi-sinusoidal oscillation, the second diode blocking a current path to the supply voltage. Thereafter, in the second half thereof, the first diode being non-conductive, the energy stored in the capacitor is again withdrawn therefrom, with the aid of the conducting transistor, to be applied to the coil, so that at the commencement of the next trace the current direction in the coil is inverted, whereafter the current drive via the amplifier circuit, the second diode now also being conducting, is effected again. The current drive of the coil during the trace period and the resonant circuit which is operative during the retrace periods result in a savings in energy compared with a current drive in both periods.

The said Patent does not discuss the problem of ringing phenomena which may occur in the resonant circuit. Disturbing ringing phenomena may occur more specifically in the case in which a shortest possible retrace period is required.

When the combination of a current drive in the trace period and a free oscillation in the retrace period of the current is used, the invention has for its object to provide a circuit in which the retrace period is as short as possible without unwanted ringing phenomena being produced. According to the invention, a circuit of the type described in the opening paragraph is characterized in that the junction of the capacitor, the first and second diodes and the transistor is fed-back via a resistor to a signal input of the amplifier comprised in the amplifier circuit, this signal input further being coupled to the first-mentioned terminal.

In the event that the circuit in accordance with the invention is used for a vertical or field deflection in television, a short retrace period up to approximately 0.4 ms can be achieved. The remaining period of time of a field blanking period of the order of magnitude of 1.2 ms can then be used for other purposes, for example, to display setting-up and test data on a television display screen, outside the display portion laid down in standards. A further example which can be mentioned is the display of television camera data at the top or the bottom of a display screen of an electronic viewer of the camera.

A further, simple embodiment of a circuit in accordance with the invention, is characterized in that the amplifier has an output, which is connected to a base electrode of the first-mentioned transistor and is coupled via a second, phase-inverting transistor to the base electrode of a third transistor a further electrode of which is connected to the second terminal, a biased fourth transistor being arranged in series with the second transistor, the first-mentioned, the third and the fourth transistors being of a conductivity type which is opposite to that of the second transistor.

This has the advantage that the first-mentioned and the third transistors are of the same conductivity type, so that a current transfer at the current drive of the coil cannot be affected by the transistors being of different conductivity types.

The invention will now be further described by way of example with reference to the accompanying drawing, wherein FIG. 1 shows an embodiment of a circuit in accordance with the invention by means of a circuit diagram, and FIG. 2 shows, to explain the operation of the circuit of FIG. 1 some signal variations as a function of the time.

In FIG. 1 reference number 1 denotes a terminal to which a sawtooth voltage U1 is applied. A possible signal variation of the voltage U1 is plotted in FIG. 2 versus the time t. In FIG. 2, possible signal variations of voltages U2, U3 and U4 and a current I, still further to be described, are plotted. Reference TV in FIG. 2 designates the period of the sawtooth voltage U1 and current I, respectively. The period TV may, for example, be the field period for television, which, depending on the television standard, may amount to 20 ms or 16.6 ms. The use of the circuit of FIG. 1 is not limited to the field or vertical deflection in television, but the circuit may be used everywhere where a sawtooth current must be generated in a coil. Hereinafter, however, the use in television is chosen by way of example. When the circuit is used for television field period TV is formed by a field scanning period TVS and a field blanking period TVB. These periods are laid down in television standards and are not shown to scale in FIG. 2, as is also the case for signal values in the several signal variations shown in FIG. 2. By way of example it holds that the field blanking period TVB may amount to approximately 1.2 ms. In FIG. 2 the period TVB is divided into a retrace period TF which is associated with the retrace of the sawtooth current I, and a period TB which indicates the remaining duration of the field blanking period TVB. Relative to the retrace period TF a trace period TT indicates the duration in which the trace of the sawtooth current I occurs. In FIG. 2 the retrace period TF is divided into a first and a second portion TF1 and TF2, respectively. The periods of time TF1 and TF2 may be approximately equal. In FIG. 2 it is shown at the voltage U1 that the retrace occurs very rapidly, at the beginning of the period of time TF1.

The voltage U1 applied in FIG. 1 to the terminal 1 is applied to a (−) input of a differential amplifier 4 by a resistor 2 and an electrolytic capacitor 3. A (+) input of the amplifier 4 is connected to a voltage terminal 5 carrying a bias voltage of, for example +8 V. This voltage and further (bias and supply) voltages are obtained from a voltage source, not shown, which has several voltage terminals which carry a constant d.c. voltage relative to the 0 V ground potential. The output of the amplifier 4 carries the voltage U2 and is connected to the base electrode of an npn-transistor 6 and a pnp-transistor 7, respectively. The emitter electrode of the transistor 6 is connected to the emitter electrode of a pnp-transistor 9 via a resistor 8. The base electrode of the transistor 9 is connected to a voltage terminal 10, which carries a bias voltage of, for example, +5 V and the collector electrode is connected to a supply voltage terminal 11 which is connected to ground which carries the 0 V ground potential. The collector electrode of the transistor 6 is connected to the cathode electrode of a diode 12, the anode of which is connected to a resistor 13. A further terminal of the resistor 13 is connected to a supply voltage terminal 14 which carries a voltage of, for example, +16 V. The collector electrode of the transistor 6 is connected to the base electrode of a pnp-transistor 15, the emitter electrode of which is connected via a resistor 16 to a supply voltage terminal 17, which carries a voltage of, for example, +16 V. The transistors 6 and 15, the resistors 13 and 16 and the diode 12 form a what is commonly referred to as a current mirror circuit. The collector electrode of transistor 15 is connected to the anode electrode of a diode 18, the cathode of which is connected to the emitter electrode of the transistor 7. The collector electrode of the transistor 7 is connected to a supply voltage terminal 19, which is connected to ground which carries a voltage of 0 V. A capacitor 20 is arranged in parallel with the diode 18, the junction of the diode 18, the transistor 7 and the capacitor 20 being connected to the cathode electrode of a diode 21. The anode of the diode 21 is connected to a supply voltage terminal 22, which is connected to ground which carries a voltage of 0 V. In the situation shown in FIG. 1, in which the terminals 19 and 22 carry the same voltage of 0 V, it is conceivable that one single terminal (19, 22) is used. The junction of the diodes 18 and 21, which have relative to this junction the same conductivity direction, the capacitor 20 and the transistor 7 with opposite conductivity direction relative to this junction, is fedback to the (−) input of the amplifier 4 via a resistor 23. The junction of the transistor 15, the diode 18 and the capacitor 20 is connected to a terminal 24, which carries the voltage U3, in this situation the voltage U4 being present at the junction of the diodes 18 and 21, the transistor 7 and the capacitor 20. The terminal 24 is connected to a terminal of a coil 25. A further terminal of the coil 25 is connected via a series arrangement of an electrolytic capacitor 26 and a resistor 27 to a voltage terminal 28, which is connected to ground which carries the 0 V voltage. The junction of the capacitor 26 and the resistor 27 is fedback via the series arrangement of an electrolytic capacitor 29 and a resistor 30 to the junction of the resistor 2 and the capacitor 3. In the drawing an arrow next to the coil 25 indicates the positive direction of the current I flowing therein. The positions of the coil 25 and the capacitor 26 may be interchanged. At the diode 21, Vd denotes a threshold voltage at which the diode 21 can become conductive, whereafter this voltage is present as a voltage drop across the conducting diode 21. The voltage Vd, which has the value of, for example, approximately 0.7 V is assumed to be equal to the base-emitter threshold voltage or the emitter-base threshold voltage, when a transistor conducts. At the transistor 7 the emitter-collector voltage drop in the conductive state is denoted by Vec.

Anticipating the description of the operation of the circuit it should be noted that the following components can be distinguished in FIG. 1: an amplifier circuit (4, 6, 7, 9, 15) indicated by the active components, a resonant circuit (25, 20, 21, 18, 7) indicated by the main components, a feedback path (29, 30) for linearization purposes at the current I and a feedback (23) whose object will appear to be a damping of possibly present, unwanted ringing phenomena at the resonant circuit (25, 20, 21, 18, 7).

For the operation of the circuit shown in FIG. 1 the following holds. The feedback (29, 30) path which provides for the linearization of the current change of the current I during the trace periods TT, which feedback is known per se will not be described in detail. The starting point is an instant located prior to the period of time TF1, at the end of the preceding trace. A linearly and parabolically increasing voltage occurs in the voltage U2 shown in FIG. 2, which voltage exceeds +5 V+2Vd. The transistors 6 and 9 then conduct current to an increasing extent, which also holds for the transistor 15. The transistor 7 is then rendered non-conductive by the voltage U2 at the base electrode, which voltage exceeds the voltage U4 at the emitter electrode. The current I flows with a linear increase in the negative direction through the coil 25, which current is produced by the transistor 15.

At the beginning of the period of time TF1 the retrace starts at the voltage U1. Via the amplifier 4 this retrace occurs in the voltage U2 as a negative-going pulse edge, more specifically until a value of, for example, +1 V. The influence of the feedback (23) is not taken account of. The transistors 6, 9 and 15 are made non-conductive by the negative-going pulse edge in the voltage U2. The current I flowing in the negative direction through the coil 25 will flow on to a decreasing extent, namely via the diode 21 and the capacitor 20; this occurs in the period of time TF1. The voltage U3 is then changed from a value of, for example, +12 V to a value of, for example, −60 V. The retrace voltage pulse value of −60 V in the voltage U3 is present at the collector electrode of the transistor 15 and at the anode electrode of the diode 18, which, in the non-conducting state can both withstand this value. Due to the fact that the diode 21 conducts, the voltage U4 cannot become more negative than the diode voltage drop of the value Vd.

At the end of the period of time TF1 the current becomes equal to 0A, whereafter the current I will start flowing in the positive direction. In the period of time TF2 this will happen via the transistor 7, whose base electrode is biased to +1 V, the voltage Vec=+1 V+Vd being present in the voltage U4. The voltage U3 then becomes rapidly less negative and passes the voltage 0 V. At the end of the period of time TF2 the voltage U3 reaches the value of +1 V+2Vd, as a result of which the diode 18, which has been non-conducting so far, can become conductive, so that the current path is now formed via the diode 18 and the transistor 7. Let it be assumed that the current I then flowing has such a value that the current flowing via the feedback path (29, 30) to the amplifier 4 plus the current flowing through the resistor 2 matches the value of the current I, so that the amplifier 4 immediately becomes operative. During the first half of the trace period TT, the voltage U2 is lower than +5 V+2Vd, so that the transistors 6, 9 and 15 are non-conducting. Until halfway of the trace period TT the positive-going current I flows in a linearly decreasing extent through the transistor 7 and the diode 18. Halfway of the trace period TT the value +5 V+2Vd is reached in the voltage U2, the transistor 7 being rendered non-conductive and the transistors 6, 9 and 15 becoming conductive to an increasing extent until the end of the trace period TT. In the manner described, a sawtooth current I having a peak-peak value of, for example, 0.8 A is generated. The voltage and current values shown in the foregoing and in FIG. 2 are given by way of example.

In the circuit of FIG. 1 the resonant circuit (25, 20, 21, 18, 7) by means of which the retrace is obtained in the short retrace period TF of the current I is predominantly formed by the coil 25, the capacitor 20, the diodes 21 and 18 and the transistor 7. In this situation, a semisinusoidal oscillation is present in the voltage U3 during the period of time the amplifier 4 is in the switched-off state. In the retrace period TF there are successively present in the voltage U4 the values −Vd (diode 21 conducts) and +1 V+Vd (transistor 7 conducts). If it is desired to have in the voltage U4 the same constant value in the retrace period TF this can be realized by applying, for example to the terminal 22 a voltage of +1 V+2Vd instead of connecting the terminals 19 and 22 to ground. A different solution is a decrease of the voltage at the terminal 19 and a decrease in the voltage U2 during the retrace periods TF, a positve voltage then possibly being applied to the terminal 22.

It can be seen that in the voltage U2 at the output of the amplifier 4 the retrace pulse present in the voltage U3 does not occur. Consequently, the amplifier 4 may always have a low output impedance, while further no higher supply voltage than the +16 V already present need be present in the circuit.

From FIG. 2 it can be seen that the retrace at the current I occurs in the retrace period TF, whereafter, in television, there still remains a period of time TB until the end of the field flyback period TVB, which is equal to approximately 1.2 ms. In practice it is possible to come to a period of time TF equal to, for example 0.4 ms, so that the period of time TB may amount to approximately 0.8 ms. The period of time TB=0.8 ms and the beginning of the trace period TT correspond in television with a strip at the top of a delay screen which is located outside the prescribed picture display area and which comprises approximately twelve television lines. In this strip, setting −Up and test data can be displayed in, for example, television cameras, more specifically on the display screen of an electronic viewer. When the fast retrace is effected at the end instead of at the beginning of the field blanking period TVB, a strip at the bottom of the display screen can be used.

From the circuit shown in FIG. 1 it can be seen that in the resonant circuit (25, 20, 21, 18, 7) there is no damping resistor for counter-acting ringing phenomena. The use of a damping resistor provided in parallel with the coil 25 will prolong the retrace period, which is unwanted. To counteract possible present, unwanted ringing phenomena, feedback of the voltage U4 via the resistor 23 is employed. The voltage U4 ensures that during the retrace periods TF the amplifier 4 is blocked with certainty, so that the resonant circuit (25, 20, 21, 18, 7) can produce the semi-sinusoidal oscillation without any damping by the amplifier 4. Feeding back the voltage U4 via the resistor 23 results in the amplifier 4 becoming immediately operative and damping the resonant circuit at the beginning of the period of time TB, so that no unwanted ringing phenomena occur. It is then important that the amplifier 4 can definitely not become operative during the retrace periods TF. The choice for the feedback of the voltage U4 the voltage decrease of which is limited by the fact that diode 21 becomes conductive results in the amplifier 4 remaining blocked after cut-off. The voltage U3 must not be used for the feedback, as this voltage by means of the negatively-going retrace pulse may render the amplifier 4 conductive during the retrace period TF, which would result in an unwanted damping of the resonant circuit (25, 20, 21, 18, 7).

What is claimed is:

1. A circuit for generating a sawtooth current in a coil, the circuit having a first terminal or receiving a sawtooth voltage and a second terminal coupled to the coil for supplyng the sawtooth current, a supply voltage terminal, an amplifier circuit including an amplifier circuit connected between said first and second terminals for converting the applied voltage into the current to be supplied during trace periods of the sawtooth current, the amplifier circuit comprising during retrace periods of the sawtooth current a resonant circuit coupled to the second terminal and including at least said coil, a capacitor, first and second diodes and a transistor, the second terminal being connected via a parallel arrangement of the capacitor and the second diode to one electrode of the first diode and one electrode of said transistor, respectfully, a further electrode of each of said first diode and transistor being connected to said supply voltage terminal, the junction of the capacitor, the first and second diodes, and the transistor being connected to the supply voltage terminal via said transistor said first and second diodes having the same forward direction, said transistor being connected with a forward direction opposite that of said first and second diodes, said transistor being biased during the retrace periods of the sawtooth current; the improvements wherein said amplifier circuit comprises an amplifier having a signal input, the junction between the capacitor, the first and second diodes and the transistor being fed-back via a resistor to said signal input of said amplifier, said signal input further being coupled to said first-terminal.

2. A circuit as claimed in claim 1 wherein said amplifier has an output connected to the base electrode of the first-mentioned transistor and further comprising a second phase inverting transistor and a third transistor, said output being coupled via said second transistor to the base electrode of said third transistor, a further electrode of said third transistor being connected to the second terminal, and a biased fourth transistor arranged in series with said second transistor, said first-mentioned, third and fourth transistors being of a conductivity type which is opposite to that of said second transistor.

* * * * *